(12) United States Patent
Bhatti et al.

(10) Patent No.: US 7,537,151 B2
(45) Date of Patent: May 26, 2009

(54) METHOD OF MAKING HIGH PERFORMANCE HEAT SINKS

(75) Inventors: Mohinder Singh Bhatti, Amherst, NY (US); Patrick Mitchell Griffin, Lake Orion, MI (US)

(73) Assignee: Delphi Technologies, Inc., Troy, MI (US)

( * ) Notice: Subject to any disclaimer, the term of this patent is extended or adjusted under 35 U.S.C. 154(b) by 488 days.

(21) Appl. No.: 11/033,334

(22) Filed: Jan. 11, 2005

(65) Prior Publication Data

US 2005/0156013 A1    Jul. 21, 2005

Related U.S. Application Data

(60) Provisional application No. 60/537,979, filed on Jan. 21, 2004.

(51) Int. Cl.
*B23K 20/00* (2006.01)
(52) U.S. Cl. .......................... 228/193; 228/175; 156/60
(58) Field of Classification Search .................. 228/183, 228/181, 193, 196, 175, 208; 156/60; 428/598, 428/593, 594; 29/592, 890
See application file for complete search history.

(56) References Cited

U.S. PATENT DOCUMENTS

| 3,445,261 | A | * | 5/1969 | Talvalkar | 503/208 |
|---|---|---|---|---|---|
| 3,904,101 | A | * | 9/1975 | Beltran et al. | 228/173.2 |
| 4,515,611 | A | * | 5/1985 | Bhatti | 65/475 |
| 4,627,864 | A | | 12/1986 | Bhatti | 65/1 |
| 4,811,892 | A | | 3/1989 | Kunzmann et al. | 228/194 |
| 5,304,846 | A | | 4/1994 | Azar et al. | 257/722 |
| 5,381,859 | A | | 1/1995 | Minakami et al. | 165/80.3 |
| 5,445,902 | A | * | 8/1995 | Soma et al. | 429/30 |
| 5,461,840 | A | * | 10/1995 | Taylor | 52/86.13 |
| 5,523,049 | A | | 6/1996 | Terpstra et al. | 419/36 |
| 5,583,317 | A | | 12/1996 | Mennucci | 174/16.3 |
| 5,691,015 | A | * | 11/1997 | Tsukamoto et al. | 428/35.2 |
| 5,800,673 | A | * | 9/1998 | Okuda et al. | 159/28.6 |
| 6,000,132 | A | * | 12/1999 | Butler | 29/890.03 |
| 6,009,937 | A | | 1/2000 | Gonner | 165/185 |
| 6,022,426 | A | | 2/2000 | Mennucci et al. | 148/527 |
| 6,134,783 | A | | 10/2000 | Bargman | 29/890.03 |
| 6,135,200 | A | | 10/2000 | Okochi | 165/121 |
| 6,195,893 | B1 | | 3/2001 | Kataoka | 29/890.032 |
| 6,199,627 | B1 | | 3/2001 | Wang | 165/185 |

(Continued)

FOREIGN PATENT DOCUMENTS

JP    6-224335    8/1994

(Continued)

*Primary Examiner*—Jessica L Ward
*Assistant Examiner*—Michael Aboagye
(74) *Attorney, Agent, or Firm*—Patrick M. Griffin

(57) ABSTRACT

A method of heat sink manufacture in which the crests of a conductive fin are nested down into close fitting grooves in a flat, conductive base plate, with small interface gaps G. A compressive material is set inside the fin crests and the grooves, viscous enough to not intrude into the gaps G, to a level sufficient to substantially fill the grooves. The work piece thus created is subjected to a cold hydrostatic oil bath, crushing the outer surfaces of the fin crests into the internal surfaces of the grooves where the compressed seal covers, while the rest of the fin is supported against net deformation by the surrounding oil.

3 Claims, 5 Drawing Sheets

U.S. PATENT DOCUMENTS

| | | | |
|---|---|---|---|
| 6,230,789 B1 | 5/2001 | Pei ............................ | 165/80.3 |
| 6,241,006 B1 | 6/2001 | Shih ........................... | 165/80.3 |
| 6,260,610 B1 | 7/2001 | Biber et al. ................. | 165/80.3 |
| 6,301,779 B1 | 10/2001 | Azar ......................... | 29/890.03 |
| 6,303,199 B1 * | 10/2001 | Takada et al. .............. | 428/34.8 |
| 6,373,699 B1 | 4/2002 | Chen .......................... | 361/697 |
| 6,475,429 B2 | 11/2002 | Osada et al. ................. | 419/27 |
| 6,538,892 B2 | 3/2003 | Smalc ........................ | 361/710 |
| 6,539,614 B2 | 4/2003 | Trobough ................... | 29/727 |
| 6,727,787 B2 * | 4/2004 | Worth et al. ................ | 333/228 |
| 6,764,751 B2 * | 7/2004 | Poirier ....................... | 428/215 |
| 2001/0032715 A1 | 10/2001 | Peng .......................... | 165/80.3 |
| 2002/0142165 A1 | 10/2002 | Norley et al. ............... | 428/408 |

FOREIGN PATENT DOCUMENTS

| | | |
|---|---|---|
| JP | 2003/124409 | 4/2003 |
| WO | 96/13350 | 5/1996 |
| WO | 02/076166 A1 | 9/2002 |

* cited by examiner

METHOD OF MAKING HIGH PERFORMANCE HEAT SINKS

This application claims the benefit of U.S. provisional patent application Ser. No. 60/537,979 for a METHOD OF MAKING HIGH PERFORMANCE HEAT SINK, filed on Jan. 21, 2004, which is hereby incorporated by reference in its entirety. This claim is made under 35 U.S.C. § 119(e); 37 C.F.R. § 1.78; and 65 Fed Reg. 50093.

A method is disclosed for making heat sinks with a plurality of elongated, separately formed, densely arrayed fins affixed to a base plate. An intimate mechanical bond between the fins and the base plate is achieved by the plastic deformation of the fins at room temperature in a cold isostatic press (CIP).

FIELD OF THE INVENTION

The subject invention relates to fabrication of cooling assemblies such as heat sinks for dissipating heat generated by electronic or non-electronic devices.

BACKGROUND OF THE INVENTION

Basically a heat sink is a heat-dissipating device comprising an array of elongated or pin fins affixed to one side of a base plate. Affixed to the other side of the base plate is a heat source such as a computer chip. The heat generated by the heat source is removed from the base plate by a fluid that is either stagnant or flowing over the base plate through the fin array. The stagnant fluid removes heat from the fins and the base plate by natural convection whereas the flowing fluid removes the heat by forced convection. Since the heat transfer rate is higher in forced convection, a flowing fluid is preferable to a stagnant fluid. A fan or a pump provides the flow of the cooling fluid through the heat sink. The extended surface provided by the fins protruding from the base plate aids greatly in dissipating heat to the circumambient stagnant or the flowing fluid.

Intense research is in progress to develop high performance heat sinks for high power electronic devices with heat flux in the range of 100 to 200 W/cm$^2$. Currently available heat sinks are designed to dissipate heat from relatively low power electronic devices with heat flux of about 25 W/cm$^2$ directly into air. Since the heat capacity of air is quite low the currently available heat sinks are not suitable for cooling high power electronic devices. Therefore, in recent years attention has turned to high performance heat sinks entailing the use of the high heat capacity fluids including single-phase liquids as well as fluids capable of undergoing liquid-to-vapor transformation as well as the reverse transformation from vapor-to-liquid. Such high performance heat sinks call for closely spaced fins of optimum dimensions including thickness, height and length Fabrication of high performance heat sinks poses many challenges dictated by the following considerations:
1. The fabrication process should not lead to distortion of the base plate to which a heat source, like a computer chip, is affixed since the base plate distortion could lead to delamination of the heat source from the base plate in service.
2. The fabrication process should be such that it lends itself for bonding fins of the optimum dimensions including thickness, height, length and spacing. The conventional fabrication processes like machining, extrusion and forging have their limitations and are incapable of producing heat sinks with relatively thin fins for optimal performance.
3. The fabrication process should yield strong and adherent bond between the fin and the base plate so as to minimize the contact resistance between the two thereby ensuring high performance of the heat sink.
4. The fabrication process should be fast and cost effective.

Taking cognizance of the foregoing requirements, a new method of fabricating high performance heat sinks for electronics cooling is developed based on the use of a so called "cold" (near room temperature) isostatic pressing processes which has not, so far as is known, been used for the fabrication of metal heat sinks with the type of fins described above. Cold isostatic processing (CIP) has been used to form non metallic heat sinks. For example, in U.S. Pat. No. 6,538,892, individual graphite disks are die pressed or isostatically pressed, stacked in a spaced array and then heat cured together. Likewise, in published US application 2002/0142065, an integral block of graphite material is isostatically formed, and then later machined into an array of elongated fins. U.S. Pat. No. 6,475,429 discloses a detailed process for CIP processing a heat sink of a particular copper and molybdenum powder mixture, but the heat sink structure itself is basically a solid plate, with a shallow central recess, and no projecting fins. While it discloses no means of forming a fin array, the patent does provide a good, basic explanation of the CIP process.

In the cold isostatic pressing process, uniform hydrostatic pressure is applied to a work piece, typically a charge of powdered metal pre formed substantially to the final shape desired, to compact the powder charge into a suitably solid, void free final shape. In the cold or "CIP" variant of the isostatic process, this is done at near room temperature. Pressure is typically applied to the work piece through the medium of a pressure transmitting elastomeric coating or "sleeve" surrounding the work piece, which, in turn, is subjected to the pressure of a surrounding, high pressure bath of hydrostatic fluid. The fluid acts omni-directionally on and through the sleeve, which stretches and gives to apply the pressure of the fluid to all the exposed surfaces of the part, while preventing the fluid from reaching the interfaces in the part being formed and compressed. The pressure is sufficient to exceed the yield strength of the work piece material, creating a plastic deformation and thorough, solid compression.

Typically, as noted, the isostatic process is applied to a powder charge to create a substantially solid, compact and void free structure, such as a plate or gear. However, a variant of the process has been used, in one known application, to mechanically bond one solid metal part to another. In U.S. Pat. No. 4,627,864, a so called discharge wall for forming a multiplicity of fibers from molten glass consists of a series of small cylindrical metal eyelets bonded in and through close fitting apertures in a metal plate. The eyelets serve as the dies for the fibers being formed. One end of each eyelet is flanged and basically flush to a first side of the plate, while the other end extends out of the aperture and above the second side of the plate. In order to manufacture the apparatus without having to individually weld each eyelet in its aperture, the patented method allows a slight variation of the standard CIP process to be used to bond all the eyelets into the plate at once. To protect the protruding ends of the eyelets during the process, a protective cover of rigid, non-compressible material is placed over them and against the second side of the plate. Then, the usual rubber-sealing sheath is placed around the entire unit, including the rigid, protective cover, evacuated, and subjected to the usual hydrostatic bath. The rubber sheath stretches and deforms into the eyelet interiors, deforming them radially outwardly and tightly into the plate apertures, while keeping the fluid completely sealed away from the part interfaces. Concurrently, the protruding ends of the eyelets remain intact, protected by the rigid cover, which is later simply lifted up and off after the sheath is removed. This process cannot be directly applied to the type of heat sink involved here, for reasons described below.

While the CIP process has not found application in the fabrication of the type of finned heat sinks described above, so far as is known, almost every other imaginable mechanical joining process has been suggested, in addition to the integral machining and one shot molding processes already described. The table below lists a sampling:

| U.S. Pat. No. | Date | Inventor(s) | Title | Remarks |
|---|---|---|---|---|
| 5,523,049 | June 1996 | Terpstra et al. | Heat Sink and Method of Fabricating | Heat sink comprising a plurality of pin fins made by molding a thermoplastic material filled with thermally conductive particles and sintering the same |
| 5,583,317 | December 1996 | Mennucci et al. | Multilayer Laminate Heat Sink Assembly | Heat sink comprising thermally bonded flat fins formed out of a laminate having a first layer of oxygen-free copper joined to a second layer of oxygen-rich copper |
| 6,000,132 | December 1999 | Butler | Method of Forming Heat Dissipating Fins | Heat sink with a base plate comprising a plurality of slots and rectangular fins swaged into the said slots |
| 6,009,937 | January 2000 | Gonner et al. | Cooling Device for Electrical or Electronic Components . . . | Base plate with rectangular studs to accommodate U-shaped fins |
| 6,134,783 | October 2000 | Bergman et al. | Heat Sink and Process of Manufacture | Air cooled heat sink comprising a plurality of extruded tubular fins affixed to a base plate with holes to provide airflow therethrough |
| 6,135,200 | October 2000 | Okochi et al. | Heat Generating Element Cooling Unit with Louvers | Air cooled heat sink with convoluted louvered fins to direct airflow |
| 6,199,627 | March 2001 | Wang | Heat Sink | Heat sink comprising a plurality of plate fins with slots and shorter spacer plates alternately arranged and held together by mechanical fasteners extending therethrough |
| 6,230,789 | May 2001 | Pei et al. | Heat Dissipating Device and Method of Making the Same | Base plate with cylindrical studs to accommodate an array of U-shaped fins with mounting holes in the flat fin crests |
| 6,241,006 | June 2001 | Shih | Heat Sink for CPU | Air cooled heat sink with two folded fin arrays secured mechanically to the base plate |
| 6,260,610 | July 2001 | Biber et al. | Convoluted Fin Heat Sinks with Base Topography for Thermal Enhancement | Heat sink comprising a folded fin array with a plurality of U-shaped fins nested in the rectangular grooves with rounded corners and secured thereto by means of a bonding agent |
| 6,373,699 | April 2002 | Chen | Heat Dissipation Device | Air cooled heat sink with extruded chassis and folded fin array secured mechanically to the chassis |

The attached drawing Figures referred to immediately below further describe the features of the type of heat sink referred to above, and further highlight the shortcomings of the known fabrication techniques disclosed in the patents referred to above. FIG. 1 shows a prior art heat sink 1 comprising an array of parallel fins 2 formed integrally with the base plate 3 by machining operation such as electron discharge machining. As already noted, the advantage of heat sink 1 is that the contact resistance between the fin and the base plate is zero since the fin is integrally formed out of the base plate. However, there are many drawbacks of heat sink 1. It is expensive and heavy due to limitations of the machining operation to produce thin fins. As noted, similar drawbacks apply to molding and extrusion processes.

FIG. 2 shows another prior art heat sink 4 comprising a base plate 5 with a plurality of rectangular grooves 6 and a plurality of parallel fins 7 of rectangular profile inserted into the said grooves 6. A shortcoming of this heat sink is that the process of inserting individual fins 7 into the grooves 6 is time-consuming and costly. Moreover, this method of fabrication does not allow fins of the optimal thickness to be used since thin fins of optimal thickness are not easy to insert in the grooves without damage. Another drawback of this heat sink is that the contiguous surfaces of the fin 7 and the groove 6 are not in intimate contact, as there tends to be an inherent gap 8 between the fin 7 and the groove 6. The gap 8 increases the contact resistance between the fin 7 and the base plate 5 thereby undermining the thermal performance of the fins. Use of a fin stock with braze coating can eliminate the gap 8 through in-situ melting of the braze coating in a furnace. However, this process leads to distortion of the heat sink and produces oxide layers thereon, which are not desirable for subsequent bonding of the heat source to the base plate.

FIG. 3 shows another prior art heat sink 9 comprising a base plate 10 with a plurality of rectangular grooves 11 and a U-shaped folded fin 12 nested in the said grooves 11. The U-shaped fins 12 can be made of desired thickness and are easier to insert in the wider grooves 11 as the inserting tool can easily pass between the adjoining vertical protrusions of the U-shaped fins. However, with this heat sink also the contiguous surfaces 13 and 14 of the fin 12 and the groove 11 are not in intimate contact. This gives rise to a gap 15 between the contiguous surfaces undermining the thermal performance of the fins due to presence of the contact resistance. Use of a fin stock with braze coating can eliminate the gap 15 through in-situ melting of the braze coating in a furnace. However, this process leads to distortion of the heat sink and produces oxide layers thereon, which are not desirable for subsequent bonding of the heat source to the base plate.

FIG. 4 shows a prior art heat sink 16 comprising a base plate 17 with an array of studs 18 protruding from the base plate 17 and a U-shaped folded fin 19 with mounting holes stamped in the flat crests of the U-shaped folds to enable press fitting of the fin 19 into the said studs 18 in the base plate 17. Another variation of this heat sink is to eliminate the studs 18 and use rivets to secure the fin 19 to the flat base plate 17. This heat sink also suffers from the drawback of the inherent contact resistance due to the gap between the fin 19 and the base plate 17. Another variation of this heat sink is to use an adhesive coating between the contacting surfaces of the fin 19 and the base plate 17. While the adhesive coating eliminates the gap between the fin and the base plate, it adds its own thermal resistance, which undermines the heat sink performance. Moreover, the effectiveness of the adhesive coating to maintain the bond strength diminishes in time and this could lead to delamination of the fins in service and consequent deterioration in the heat sink performance.

The obvious, straightforward application of the isostatic pressing process described above would be completely ineffective in joining fins like those shown in FIGS. 2 and 3 to a base plate. If an elastomeric sleeve were wrapped over the entire assembly of fins and base plate, and then subjected to a surrounding bath of pressurized fluid, the fin array would be crushed and deformed. If the pre assembled array of fins and base were directly immersed in the pressurized fluid bath, without a surrounding sealing sleeve, fluid would readily enter the interface between the fins and the base, preventing any fin to base joining action from occurring. Nor could one "protect" the fins from the crushing effect of the surrounding sleeve with a rigid cover, in the manner disclosed in U.S. Pat. No. 4,627,864, because such a cover placed over and shielding the fins would also inevitably prevent the compressive action of the fluid deformed sleeve from reaching the very fin to plate interfaces that would need to be compressed.

SUMMARY OF THE INVENTION

The invention provides a method of fabricating the heat sink with an array of pre fabricated fins on a base plate, utilizing a variation of the isostatic process described above, but with novel additions that allow the process to actually work.

As disclosed, a closely spaced array of thin, corrugated fins is nested so as to place their lower crests directly within the grooves in the otherwise solid base plate, with no intermediate braze material, adhesive, or other mechanical fastener at the fin to groove interface. Then, the assembly is placed in an evacuated chamber, removing substantially all air from the fin to base plate groove interfaces. Next, a localized, targeted hermetical seal material is applied at, and, as far as the fins are involved, only at, the interfaces between the fins and grooves, filling the interiors of the fin crests, and the intervening spaces between the fin walls, to a level slightly above the surface of the base plate. This seals the gaps between the fin crests and the base plate grooves. That portion of the fins extending above the sealed crests (above base plate upper surface) is left open and unsupported. The seal material is compressible, not rigid, but is significantly different in size, shape and function from the kind of all encompassing, unitary, evacuatable sleeve that is conventionally used. This localized fin to groove interface seal may be provided, for example, by a poured in place fill of a water soluble elastomeric coating, such as polyvinyl alcohol (PVA), which fills the relatively wide interior of the fin crests, but which is too viscous to flow into the much narrower interfaces between the exterior of the fin crests and the grooves. After the targeted seal is applied, the fin and base plate assembly is removed from the evacuated chamber. The seal, while not evacuated per se, as a sleeve is, still protects the sealed interface from air entry. Then, the sealed sub assembly is subjected to the same type of isostatic pressure apparatus described above, at a pressure exceeding the room temperature yield strength of the fin and base plate material, at the relatively cool temperatures typically utilized in the CIP process. The omni directionally acting fluid does not crush the fins, as it would if acting on a surrounding sleeve, but instead surrounds and intersperses between the fins, acting equally in all directions. Just as an open container is not crushed under deep water, so the open portion of the fins are undisturbed. At the sealed interface, however, the pressurized fluid, which is prevented from entering the fin to groove interfaces, instead presses on the seal material. The seal material inside the fin crests transfers pressure to the fin-groove interfaces, deforming the fin crests plastically into an intimate, mechanical bonding relationship with the grooves within which they are seated. The seal material may then be removed by stripping or dissolution in a solvent such as water. If required, the assembly may then be heat treated to form even stronger, diffusion type metallurgical bonds between the fins and the base plate.

DETAILED DESCRIPTION OF THE PREFERRED EMBODIMENTS

Figure 1:
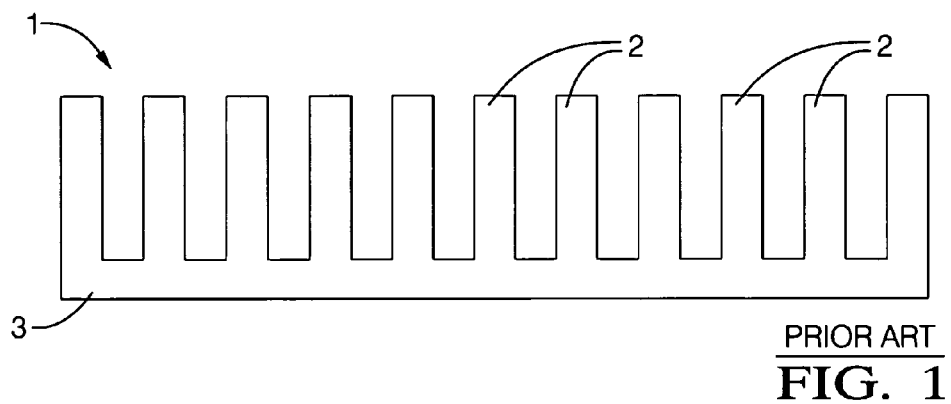
FIG. 1 shows a prior art monolithic heat sink made by machining, extrusion or forging operations.
Figure 2:
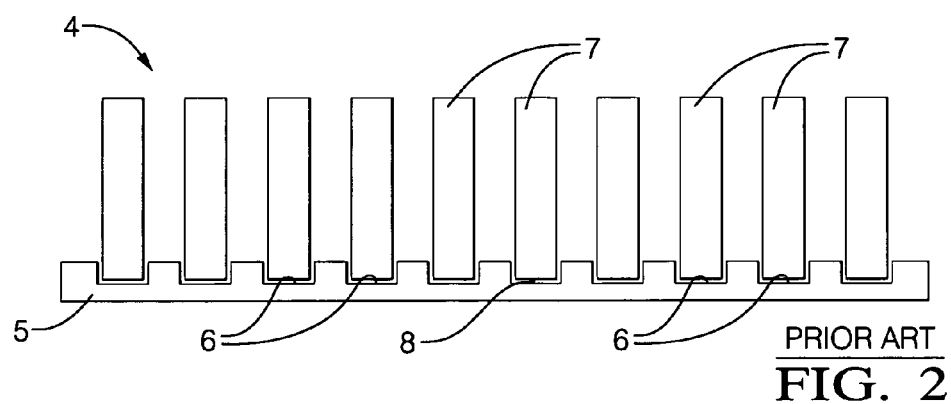
FIG. 2 shows a prior art heat sink with an array of discrete parallel fins nested in the base plate grooves by an insertion tool.
Figure 3:
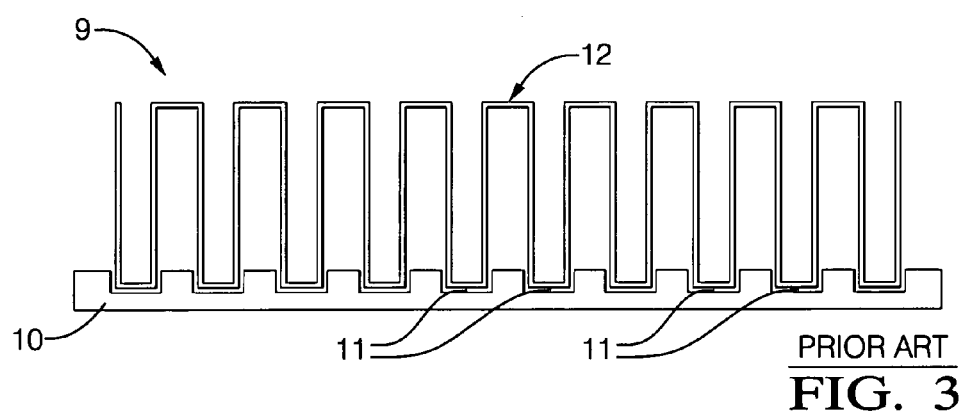
FIG. 3 shows a prior art heat sink with a folded fin array comprising a plurality of U-shaped fins nested in the base plate grooves by an insertion tool.
Figure 4:
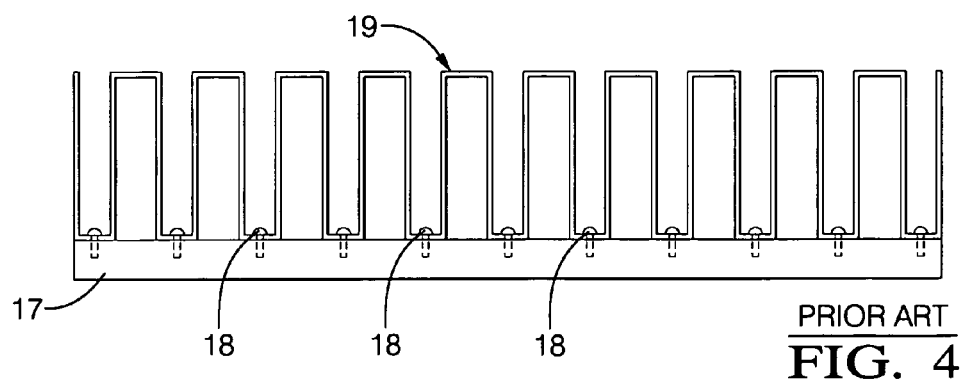
FIG. 4 shows a prior art heat sink with a folded fin array comprising a plurality of U-shaped fins nested in the base plate grooves by means of the studs protruding from the base plate.
Figure 5:
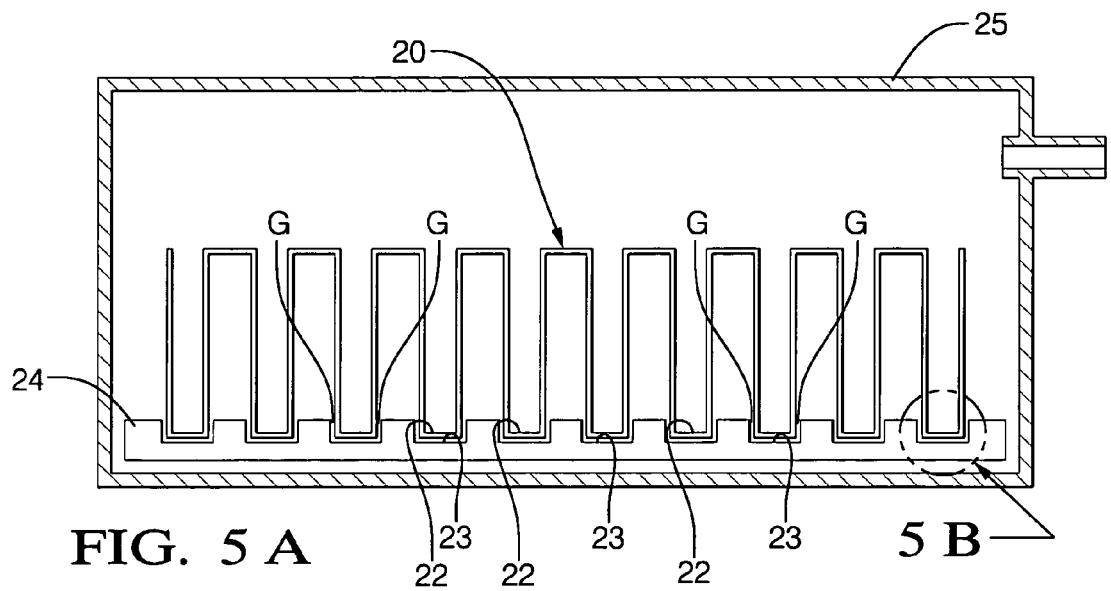
FIGS. 5A and B show a view of the base plate and a folded fin array comprising a plurality of folded, U-shaped fin with lower crests nested in the rectangular grooves of the base plate at a first step of fabrication by the process of the invention.
Figure 5:
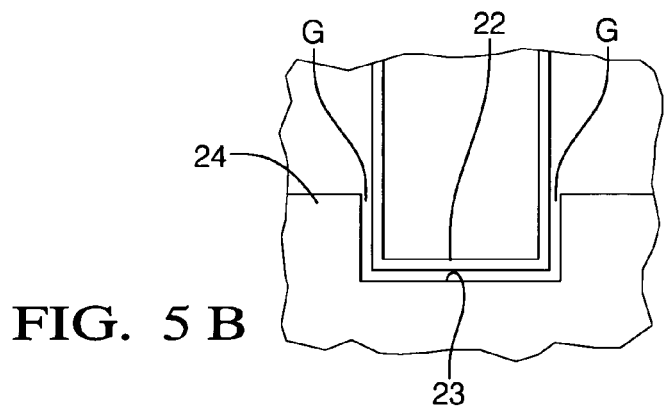

FIG. 5 is a view of a heat sink pre assembly (not yet fully formed) with a folded comprised of a generally rectangular or U shaped folded fin 20 having a plurality of lower crests 22, which are nested in rectangular grooves 23 in a base plate 24. The crest 22 can be considered the short fold between fin walls and a short portion of the integral fin wall to either side thereof, having a basic U shape. This nesting would be done so as to create minimal gaps "G" between the exterior surfaces of the crests 22 and the interior surfaces of the base plate grooves 23, as by a controlled, close press fit. While shown exaggerated for purposes of illustration, no press fit can fully close the gaps g sufficiently to create a sufficiently intimate, solid interface for efficient heat conduction. This fin-plate pre assembly is placed in an evacuatable "glove box" 25, so named because hermetic gloves or the like can be used to manipulate work pieces inside the box without jeopardizing the seal. As box 25 is evacuated, trapped air is removed the from the gaps g.

Figure 6:
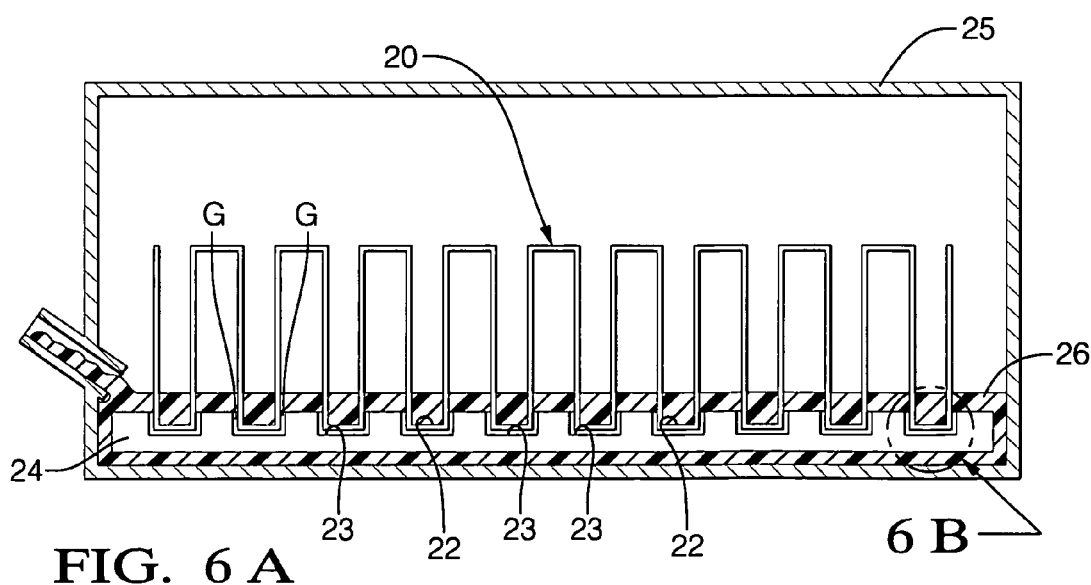
FIGS. 6A and B show a view at a later step in the process, as the novel seal means is being applied.
Figure 6:
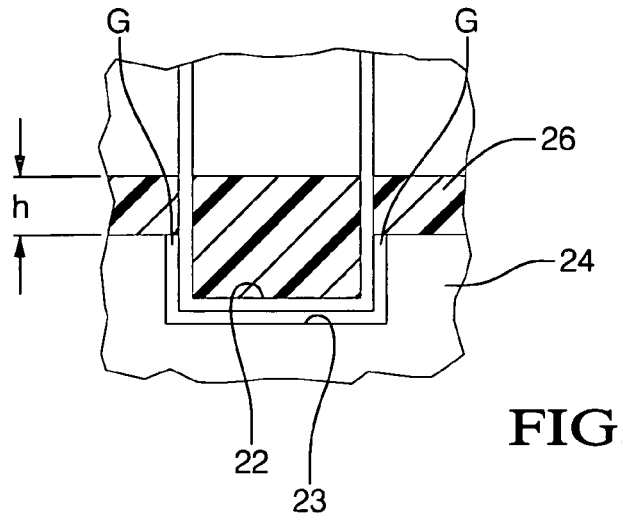

Referring next to FIGS. 6A and B, after evacuation, an elastomeric coating material, such as polyvinyl alcohol (PVA, a colorless and water soluble resin with chemical formula [—$CH_2CHOH$—]$_n$) is poured in liquid form within the evacuated glove box 25 so as to fill the interior of the fin crests 22 and the adjacent, intervening spaces between the fin walls, up to a level or thickness "h" above the upper surface of the base plate 24. To determine an effective seal thickness "h," it should be kept in mind that there should be no intrusion of seal material into the gaps G. The condition under which the permeation of the liquid can be prevented is expressible by the relation $$\rho h \left( \frac{g}{g_c} \right) \leq \frac{2\sigma}{\delta} \quad (1)$$

where
h is the height of the liquid column above the gap (shown in FIG. 5), ft
g is the acceleration due to gravity=32.174 ft/s$^2$
$g_c$ is the constant of proportionality in Newton's second law of motion=32.174 ($lb_m$/$lb_f$)·(ft/s$^2$)
δ is the gap width (shown in FIG. 5), ft
ρ is the density of the liquid, $lb_m$/ft$^3$
σ is the surface tension of the liquid, $lb_f$/ft The left hand side of Eq. (1) represents the downward acting hydrostatic force ρhg/$g_c$ of the liquid column of height h (FIG. 5) directly over the gap G with a width δ. The right hand side of Eq. (1) represents the upward acting surface tension force 2σ/δ along the periphery of the gap at the bottom of the liquid column. Stated in words, Eq. (1) asserts that the superincumbent column of liquid of height h directly over the gap of width δ will not permeate the gap if the hydrostatic force of the liquid column is less than or equal to the surface tension force along the periphery of the gap at the bottom of the liquid column.

Solving Eq. (1) for h, we obtain the permissible thickness h of the elastomeric coating material as $$h \leq \frac{2 g_c \sigma}{\rho g \delta} \quad (2)$$

To illustrate use of Eq. (2), we apply it to a gap width δ=0.001 in.=8.3×10$^{-5}$ ft involving the use of a polyvinyl alcohol with room temperature surface tension σ=68 dynes/cm=46.6×10$^{-4}$ $lb_f$/ft and density ρ=1.3 g/cm$^3$=81.2 $lb_m$/ft$^3$. Introducing these values into Eq. (2) together with the aforementioned values of g and $g_c$, we obtain the permissible coating thickness as h≦16.6 in. In actual practice, a coating thickness h in the range 0.125 to 0.25 in. is used. For interferingly nested fin crests 22 with gaps G of the order of 0.001 in., the coating materials like polyvinyl alcohol will not permeate or intrude into the gaps G. Should a more intrusive sealing material be used, or a significantly wider gap G, it would be possible to provide a removable caulking material wound around the interfaces, such as a narrow thread or the like. In addition to covering the gaps G, the seal material may form around the remaining exterior surfaces of the base plate 24 as well, to any desired thickness, although any thickness larger than "h" would be unnecessary.

Figure 7:
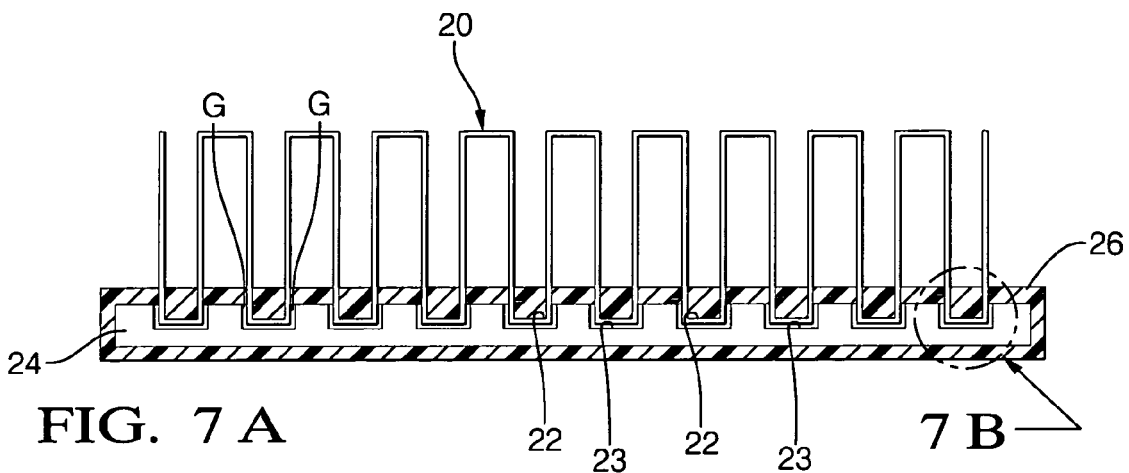
FIGS. 7A and B show the work piece of base plate and fin after the seal means has been applied.
Figure 7:
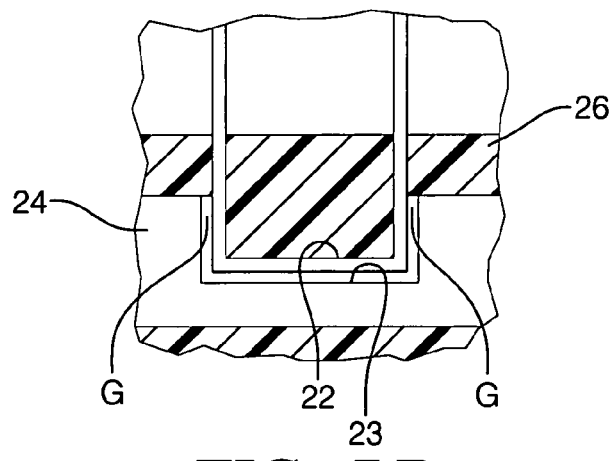

Referring to FIGS. 7A and B, after curing, the hermetically sealed fin-plate pre assembly with seal 26 is removed from the glove box 25 for further process. The hermetic sealing of the gaps G is maintained by the seal 26, which is critical for subsequent bonding of the fins crests 22 to the base plate 24 in the cold isostatic press.

Figure 8:
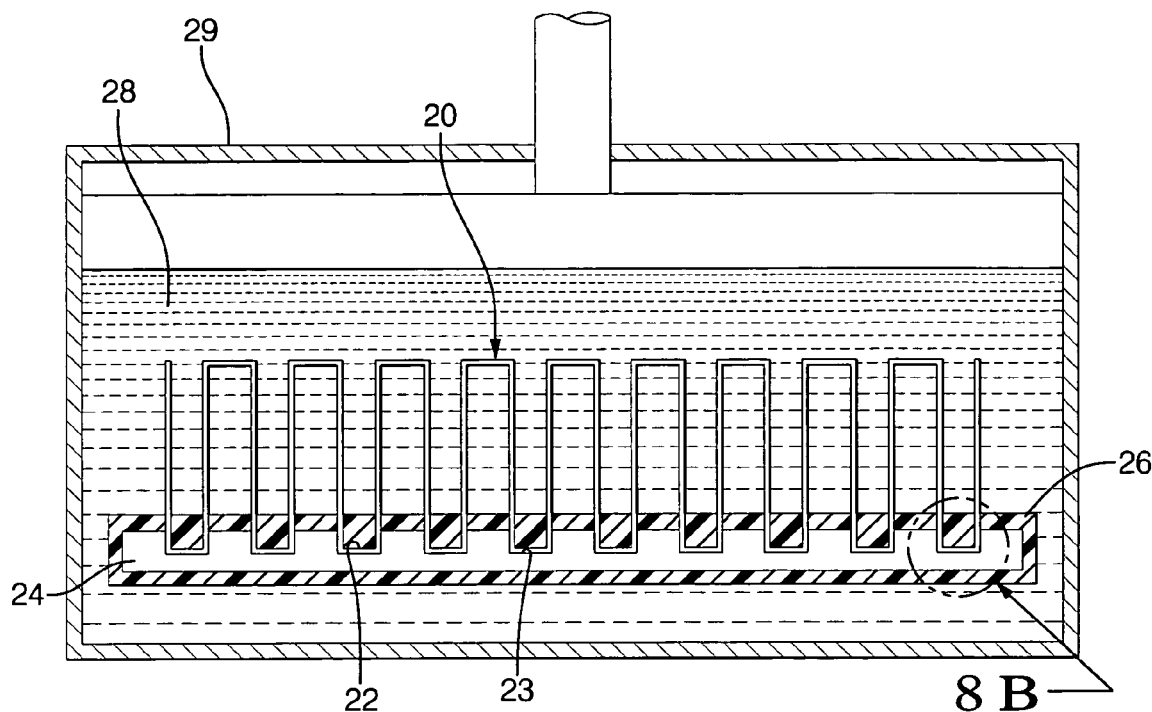
FIGS. 8A and B show the base plate, fin and seal assembly work piece during application of the omni-directional, uniform hydrostatic pressure in the isostatic press.
Figure 8:
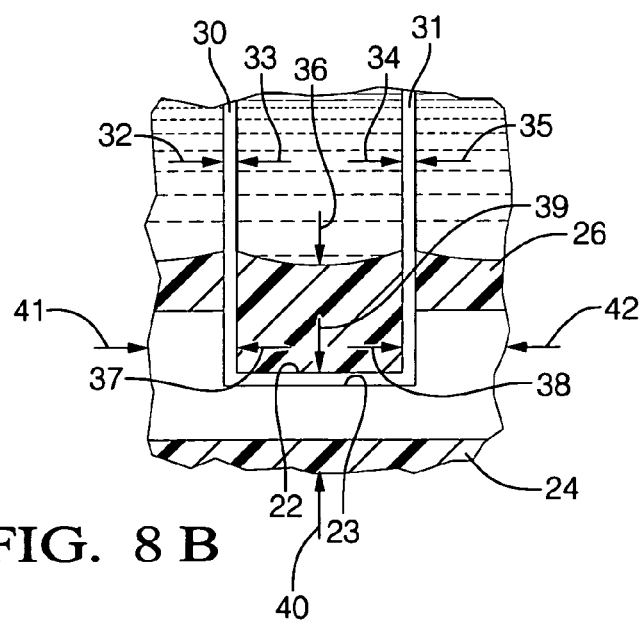

Referring to FIGS. 8A and B, the hermetically sealed work piece of fin 20, base plate 24, and cured seal 26 is introduced into the oil bath 28 of a conventional cold isostatic press 29 and subjected to the omni-direction uniform hydrostatic pressure of the order of 150,000 psi, exceeding the room temperature yield strength of the fin material. The room temperature yield strength of pure aluminum is 1,500 psi in annealed condition and 16,400 in work-hardened condition. The room temperature yield strength of pure copper is 10,000 psi in annealed condition and 50,000 psi in work-hardened condition. FIG. 8B shows an enlarged view of one fin crest 22 within a groove 23, with two fin walls 30 and 31 extending above the surface of base plate 24. Arrows illustrate the effect of the omni-directional uniform hydrostatic pressure inside the oil bath of the cold isostatic press. The arrows 32, 33 and 34, 35 representing opposed, equal pressures, illustrate why there is no distortion of the fin walls 30 and 31, analogous to an open container deep underwater. That omni-directional force acts equally on each side of the fin walls 30 and 31, both the portion thereof that is surrounded on each side by the oil, and on that much shorter portion that extends above the surface of the base plate 24, and which is surrounded on each side by the seal material 26. Where the fin crest 22 extends below the surface of the base plate 24, into groove 23, however, the situation is different. There, the sides of the fin crest 22 are not symmetrically bounded by pressure transmitting media on each side. Instead, the internal surfaces only of the crest 22 are exposed to pressure, as indicated by the arrow 36, applied through the elastomeric seal material 26 that fills the inside only of crest 22 and which, in accordance with Pascal's law, transmits pressure equally undiminished in all directions, as indicated by the arrows 37, 38 and 39. Since the gap G is devoid of any trapped air, seal material, or any other pressure transmitting medium, that internal pressure applied within the fin crest 22 is not equally and oppositely resisted, and deforms the fin material plastically thereby closing the gap G and establishing intimate mechanical bonds between the contiguous exterior surfaces of the fin crest 22 and the internal surface of the groove 23. It may be noted that the pressure indicated by the arrows 40, 41 and 42 is applied to the effectively rigid surfaces of the base plate 24 (effectively rigid relative to the material of seal 26) and is not transmitted to the walls of the groove 23. It serves rather to balance the pressure exerted through the elastomeric seal 26 as indicated by the arrows 36, 37, 38 and 39 thereby forcing the closure of the gaps G. The deformation by the oil of the seal 26 within the fin crests 22, and between adjacent fin crests 22, is indicated in exaggerated form for purposes of illustration. The compressive action serves to strengthen the sealing action of the seal to 26 either side of and against each fin wall 30 and 31, in proportion to the pressure acting thereon, and preventing intrusion of the pressurized oil.

After bonding the fin crests 22 to and within the base plate grooves 23 by the CIP process carried out in the in the cold isostatic press, as described above, the fin-plate assembly is removed from the oil bath of the cold isostatic press and placed in a water tank (or other solvent) to dissolve the elastomeric seal 26. Some seal materials may lend themselves to purely mechanical stripping, or a combination of such steps could be used. The assembly of base plate 24 and fin 20 thus formed is free from any unwanted distortions and oxidation layers.

The plastically formed mechanical bond between the external surfaces of the crests 22 and the plate grooves 23 may be further strengthened, if desired, by a last thermal treatment, at a temperature high enough to create diffusion bonding. The intimate surface-to-surface contact created by the isostatic pressing action allows such diffusion to occur. In the normal operation of the heat sink, the plastically formed mechanical bond will strengthen naturally due to the temperature gradients established across the interface between the contiguous surfaces of the fin crests 22 and the grooves 23. For this to occur, it is desirable that the fin 20 and the base plate 24 be made of the same material so that they have the same expansion coefficient, which serves to maintain integrity of the interface in service. It is also possible to form a hybrid heat sink with fins of a material with higher coefficient of expansion (e.g., aluminum) and the base plate of a different material with lower coefficient of thermal expansion (e.g., copper) so that the thermal stresses in service will strengthen rather than weaken the mechanical bond between the fin and the base plate due to difference in the thermal expansion coefficients. It may be noted that the coefficient of thermal expansion of aluminum is $13 \times 10^{-6}$ in./in.° F. and that of copper is $9.6 \times 10^{-6}$ in./in.° F. Thus the aluminum fins will expand more than the grooves 23 in the copper base plate thereby seating the fin crests 22 more tightly within the grooves 23.

Figure 9:
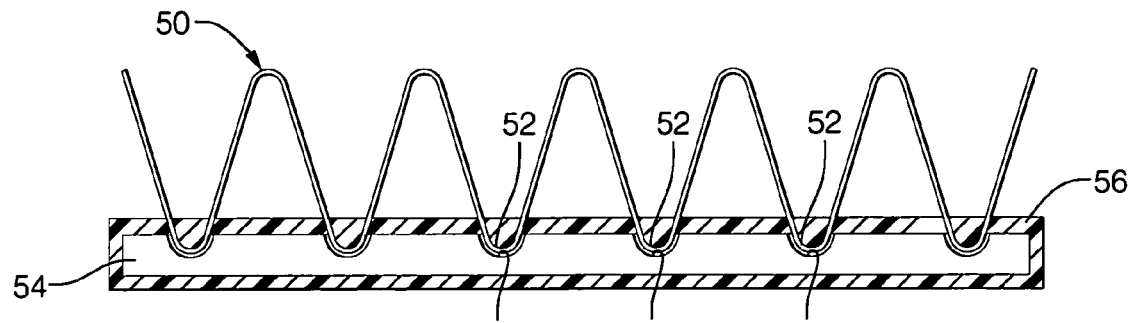
FIGS. 9 and 10 show a base plate and sinusoidal type folded fin, after application of the seal material, and undergoing compression in the isostatic press.
Figure 10:
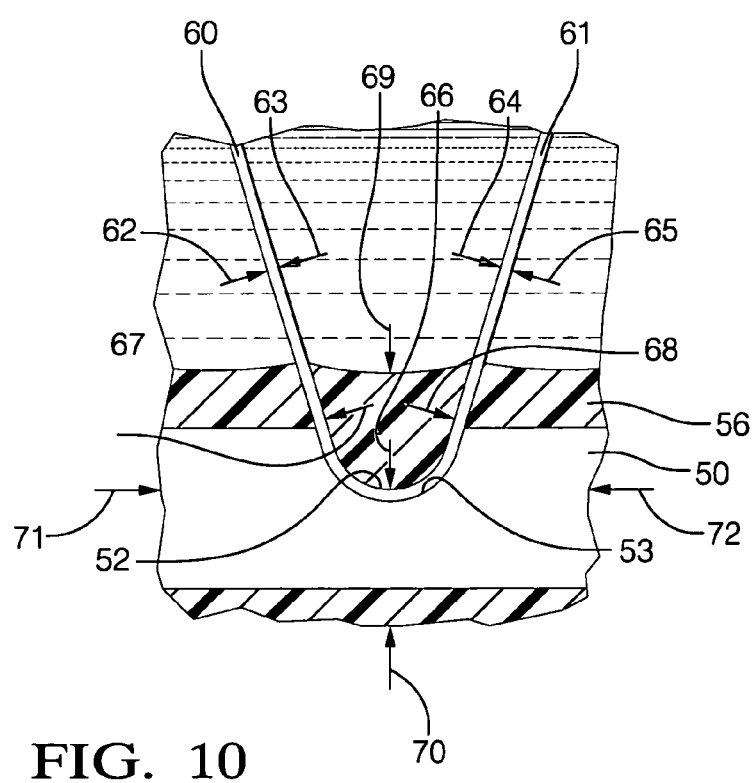

FIGS. 9 and 10 are a view of an alternate design heat sink pre assembly, already formed as a CIP ready work piece by the same method described above, but with a folded sinusoidal fin 50 having rounded crests 52 secured in rounded grooves 53 in a base plate 54. An advantage of the sinusoidal fin 50 over the flat or square crest fin 20 is that it is easier to install in the rounded crests 52 in the matching grooves 53. The details of the evacuation process acting on the gaps G and sealing process thereof are the same, leaving a similar seal 56 covering the interfaces as above. FIG. 10 shows the work piece under the application on the same omni-direction uniform hydrostatic pressure inside the oil bath of the cold isostatic press. The details of the application of the hydraulic pressure in FIG. 10 indicated by the arrows 62 through 72, acting symmetrically to either side of the two fin walls 60 and 62 bounding the fin crest 52, within the fin crests 52, and on the bottom and side surfaces of the base plate 54, are identical with the details associated with the corresponding, similarly numbered structures in FIGS. 8A 8B, and need not be repeated here. The end result of the CIP operation, as above is the closure of the gaps G between the rounded fin crests 52 and the rounded grooves 53 in the base plate 54, without distortion of the majority of the fin 51.

The invention claimed is:

1. A method of manufacturing a heat sink, comprising the steps of, providing a base plate of metallic material having an upper surface formed with a series of parallel grooves, providing a folded fin of metallic material of sufficiently small wall thickness to be plastically deformable, and having a series of open crests sized to fit closely within the plate grooves, positioning a fin crest within each base plate groove so as to leave gaps G of predetermined width between the exterior surfaces of the crests and the internal surfaces of the grooves, placing the fin-base plate assembly in an evacuated chamber to remove substantially all air from the gaps G, after substantially all air is removed from the gaps G, forming a seal of polyvinyl alcohol (PVA) within and around the fin crests and above the upper surface of the base plate to a thickness "h" sufficient to cover and seal the gaps G and prevent the entry of material that forms the seal into the gaps G, to thereby form a work piece placing the work piece in a pressurized bath of hydraulic fluid and subjecting it to omni-directionally acting pressure sufficient to act on the seal material internal to the crests and plastically deform the exterior surfaces of the crests outwardly and into intimate contact with the internal surfaces of the base plate grooves, and, removing the seal of polyvinyl alcohol (PVA) by mechanical stripping, by water immersion, or by a combination thereof;

in which said thickness "h" of said polyvinyl alcohol (PVA) is determined by the equation:

$$h \leq \frac{2g_c \sigma}{\rho g \delta}$$

Where:
h is thickness of said seal of PVA, ft
g is the acceleration due to gravity=32.174 ft/s²
$g_c$ is the constant of proportionality in Newton's second law of motion=32.174($lb_m$/$lb_f$)·(ft/s²)
δ is the gap width (shown in FIG. 5), ft
ρ is the density of PVA, $lb_m$/ft³
σ is the surface tension of PVA, $lb_f$/ft.

2. The method according to claim 1, in which the work piece is heat treated, after removing the seal material, at a temperature sufficiently high to create diffusion bonding between the exterior surfaces of the fin crests and the internal surfaces of the base plate grooves.

3. The method according to claim 1, in which the folded fin and base plate material have a comparable coefficient of thermal expansion.

* * * * *